United States Patent
Tabe et al.

(10) Patent No.: US 9,572,279 B2
(45) Date of Patent: Feb. 14, 2017

(54) CONTAINER-TYPE DATA CENTER

(71) Applicant: HITACHI SYSTEMS, LTD., Tokyo (JP)

(72) Inventors: Kenichi Tabe, Kanagawa (JP); Takeshi Kobayashi, Ibaraki (JP); Yutaka Asano, Tokyo (JP)

(73) Assignee: Hitachi Systems, Ltd., Tokyo (JP)

( * ) Notice: Subject to any disclaimer, the term of this patent is extended or adjusted under 35 U.S.C. 154(b) by 0 days.

(21) Appl. No.: 14/776,019

(22) PCT Filed: Apr. 24, 2013

(86) PCT No.: PCT/JP2013/062036
§ 371 (c)(1),
(2) Date: Sep. 14, 2015

(87) PCT Pub. No.: WO2014/174604
PCT Pub. Date: Oct. 30, 2014

(65) Prior Publication Data
US 2016/0029508 A1 Jan. 28, 2016

(51) Int. Cl.
*G06F 1/16* (2006.01)
*H05K 5/00* (2006.01)
(Continued)

(52) U.S. Cl.
CPC ........ *H05K 7/1497* (2013.01); *H05K 7/20745* (2013.01)

(58) Field of Classification Search
CPC .... H05K 7/1497; H05K 7/20745; H05K 7/20; H05K 5/02; H05K 7/18; G06F 1/1656; G06F 1/1633; G06F 1/12; B60N 2/522; B60N 2/505; B60N 2/54; B60N 2/544; B60N 2/548
(Continued)

(56) References Cited

U.S. PATENT DOCUMENTS 3,754,803 A * 8/1973 Underwood ........... B65D 81/07
217/55
5,398,466 A * 3/1995 Oyama ............. E04F 15/02482
52/126.6
(Continued)

FOREIGN PATENT DOCUMENTS

| CN | 102625606 A | 8/2012 |
|---|---|---|
| JP | 60-5372 | 2/1985 |

(Continued)

OTHER PUBLICATIONS

International Search Report for corresponding International Application No. PCT/JP2013/062036 mailed Jul. 9, 2013.
(Continued)

*Primary Examiner* — Jennifer E Novosad
(74) *Attorney, Agent, or Firm* — Renner, Otto, Boisselle & Sklar, LLP

(57) ABSTRACT

A container-type data center enabling transportation while having IT equipment stored therein, Vibration isolation table units laid on a floor surface in a storage unit of a container are composed of a lower plate and an upper plate, and multiple spring vibration isolators are fixed between the plates. The lower plates of adjacent vibration isolation table units are fixed via a lower fixing member, and upper palates of adjacent units are fixed via an upper fixing member. Two racks are loaded per single vibration isolation table unit. By adopting this configuration, even when shock is applied on the container, the vibration transmitted from the container can be absorbed by the spring vibration isolator. Thus, even when the container is transported with the IT equipment and the like stored in the rack, it becomes possible to prevent the occurrence of failures such as fluctuation of the IT equipment, fall of the equipment by vibration, or detachment of internal components.

11 Claims, 4 Drawing Sheets

(51) Int. Cl.
*H05K 7/00* (2006.01)
*H05K 7/14* (2006.01)
*H05K 7/20* (2006.01)

(58) Field of Classification Search
USPC ..... 211/26.2; 312/223.2; 248/562, 564, 565,
248/570, 576, 636; 361/679.34, 679.48,
361/679.46, 679.35, 679.36, 688
See application file for complete search history.

(56) References Cited

U.S. PATENT DOCUMENTS

| | | | | |
|---|---|---|---|---|
| 6,530,563 | B1* | 3/2003 | Miller | F16F 7/14 |
| | | | | 188/378 |
| 6,751,096 | B2* | 6/2004 | Aldon | H05K 9/0015 |
| | | | | 174/377 |
| 7,187,543 | B2* | 3/2007 | Zimlin | G11B 33/08 |
| | | | | 211/187 |
| 7,551,971 | B2* | 6/2009 | Hillis | H05K 7/1497 |
| | | | | 267/140.11 |
| 7,856,838 | B2* | 12/2010 | Hillis | H01L 23/467 |
| | | | | 312/223.2 |
| 8,322,679 | B2* | 12/2012 | Chen | H05K 7/1497 |
| | | | | 248/562 |
| 9,351,425 | B2* | 5/2016 | Tabe | H05K 7/20745 |
| 2008/0123288 | A1 | 5/2008 | Hillis | |
| 2012/0113570 | A1* | 5/2012 | Yang | H05K 7/1495 |
| | | | | 361/679.01 |
| 2012/0194046 | A1 | 8/2012 | Chen | |
| 2012/0243171 | A1* | 9/2012 | Spaulding | F16F 15/04 |
| | | | | 361/679.34 |
| 2016/0029508 | A1* | 1/2016 | Tabe | H05K 7/20745 |
| | | | | 361/679.48 |
| 2016/0057892 | A1* | 2/2016 | Tabe | G06F 1/20 |
| | | | | 361/679.46 |

FOREIGN PATENT DOCUMENTS

| | | |
|---|---|---|
| JP | 04-76860 | 7/1992 |
| JP | 09-032261 | 2/1997 |
| JP | 2002-128185 | 5/2002 |
| JP | 2003-177836 | 6/2003 |
| JP | 2006-298298 | 11/2006 |
| JP | 2013-004097 | 1/2013 |

OTHER PUBLICATIONS

Form PCT/ISA/237 for corresponding International Application No. PCT/JP2013/062036 dated Jul. 9, 2013.
Notification of Reasons for Refusal for corresponding Japanese Application No. 2014-543385 dated Dec. 9, 2014 and English translation.
Decision to Grant a Patent for corresponding Japanese Application No. 2014-543385 dated May 12, 2015 and English translation.
https://www.hitachi-systems.com/solution/s006/fmitsm/cdc.html with partial English translation, obtained via Internet on Jul. 22, 2015.

* cited by examiner

CONTAINER-TYPE DATA CENTER

TECHNICAL FIELD

The present invention relates to a container-type data center, and specifically, relates to a container-type data center capable of having the container transferred while having IT equipment and air conditioning facilities for cooling the container disposed within the container of the container-type data center.

BACKGROUND ART

A container-type data center has necessary facilities for constituting a data center stored in a container-type box used as a cargo transportation means using a trailer or the like, as taught in Non-Patent Literature 1. Actually, a container-type data center can store servers, storage apparatuses, control devices, air-conditioning facilities and power supply facilities, so that the container itself can be operated as a data center. It is possible to recognize the container-type data center as a new form of data center capable of being installed outdoors or being transported.

It has been recognized in Japan that the use of such container-type data centers are difficult due to the restrictions by the Building Standards Act, but on Mar. 25, 2011, a notice has been issued from the Ministry of Land, Infrastructure, Transport and Tourism on "Handling of the Building Standards Act regarding Container-type Data Center". According to the notice, "Regarding container-type data centers that can be disposed independently on land, those having only a main body of a server device and facilities required for realizing the functions of the data server installed therein having minimum internal space required for realizing the functions of the data server such as the airway for air conditioning, and which are unattended during operation so that a person only enters the container when a serious failure occurs to the devices installed therein, are classified as a storehouse or other similar facilities defined in Article 2 item 3 of the Law. However, when multiple data centers are stacked, they are handled as a facility corresponding to a building architecture, instead of a storehouse or other similar facilities."

As for containers, the size of the external shape of the container is prescribed based on ISO Standards, and in many cases, 40-feet-type containers are assigned as the container-type data centers. In the prior-art container-type data center, outdoor units of the air conditioning facility were disposed outside the container, so that it was necessary to arrange the container-type data center at a determined location, install outdoor units for air conditioning near the container, and then connect the air conditioning piping with indoor units of the data center.

Patent Literature 1 (Japanese Patent Application Laid-Open Publication No. 2006-298298) discloses a vibration isolator of a container or the like, and the method for using the same, applicable to commonly used containers, and protecting loaded articles from vibrations when being transported while suppressing costs, wherein a vibration isolator of a container or the like is disposed in a transporting container or under a merchandise transport pallet to provide vibration isolation, in which a buffer member is disposed between a base frame and a loading frame, having notch receiving constitutions of twist locks disposed at least at four corners of the base frame, and twist locks are disposed at the corresponding parts of the loading frame.

Patent Literature 2 (Japanese Patent Application Laid-Open Publication No. 2013-4097) discloses providing a container-type data center capable of suppressing vibration, including a container and a number of cabinets arranged in the container, wherein a first shockproof device and a second shockproof device are mounted to the bottom and the top of each of the cabinets, the second shockproof device including a shockproof member and a connecting apparatus arranged between the shockproof member and the container to connect the shockproof member and the container, wherein the connecting mechanism is adjusted to either have the shockproof member abut to or move away from the container.

Patent Literature 3 (Japanese Patent Application Laid-Open Publication No. 2003-177836) discloses a portable computer room which can be easily installed, and can be immediately used from the day it is installed, and a method for constructing the portable computer room, wherein the computer room is composed of a room box and various pieces of equipment in the room box. The room box is shaped like a rectangular parallelepiped, and its side wall and top plate are covered with an electromagnetic shield, having damping legs mounted on the back face of the floor. An entry system is mounted on the side part of a door. This system executes entrance and exit control and security management of the room. Servers are operated by a DC power source from a power unit. Terminal equipment installed in the room is connected to a wiring panel. An optical access device converts optical signals entered from the outside through an optical fiber into electric signals, and outputs the same to the servers. A video monitoring device constantly takes images inside the room.

Patent Literature 4 (Japanese Utility Model Publication No. S60-5372) discloses an electronic device system unit characterized in comprising an electronic device unit having electronic devices mounted on a pallet having a vibration proof double-floor structure formed by integrating an upper side mounting floor and a lower side fixing frame with a shock absorbing member sandwiched therebetween, having cables used for connecting the electronic devices mutually or for connecting the devices with external devices wired in the underfloor space of the pallet and having a connecting terminal for connecting a portion of the cables and to external wiring at the end of the pallet, and a movable container unit having at least a power supply device and an air conditioning device installed in a casing having a waterproof and heat insulating structure and accommodating the electronic device unit that is fixed in a detachable manner to a fixing frame of the pallet.

CITATION LIST

Patent Literature

[PTL 1] Japanese Patent Application Laid-Open Publication No. 2006-298298
[PTL 2] Japanese Patent Application Laid-Open Publication No. 2013-4097
[PTL 3] Japanese Patent Application Laid-Open Publication No. 2003-177836
[PTL 4] Japanese Utility Model Publication No. S60-5372

Non-Patent Literature

[NPL 1] https://www.hitachi-systems.com/solution/s006/fmitsm/cdc.html

SUMMARY OF INVENTION

Technical Problem

However, according to the invention disclosed in the above-mentioned patent literatures, the vibration isolation structure is applied throughout the whole pallet surface (floor surface) of the container unit, and it was necessary to attach vibration isolation members to corners or the intermediate end portion of the pallet surface (floor surface). Therefore, considering the actual arrangement, in order to install a system unit (IT equipment) to an arbitrary location within the container, it was difficult to correspond flexibly thereto and to provide an effective and efficient vibration isolating measures.

According further to the above-described cited literatures, the container itself will be extremely heavy, the shock absorbing member must adopt a large-scale configuration, and the load applied on the container may cause damage to the shock absorbing member, so that it is a burden on the users from the viewpoints of both manufacturing cost and maintenance cost, and since the container itself is not provided with a vibration isolation function, there was fear that vibration and shock may be applied on the product being stored in the container when the container is moved from a trailer using a crane or the like. When this container-type data center is transported using a trailer or the like, a situation may occur where serious vibration is applied due to the road surface condition or the like, and if various electronic devices and the like are mounted on racks while being transported, problems remain to be solved, so that in most actual operation, the various electronic devices had to be installed after the data center has reached the destination in order to ensure safety. In other words, the IT equipment to be accommodated in the container had to be packaged separately since they are extremely sensitive to vibration and shock, and only after the container has been transported and installed, the packaged pieces of IT equipment were disposed on racks and the like, so that a time loss had been caused since the container could not be operated as a data center immediately after transporting the container.

One of the objects of the present invention is to provide a vibration isolation structure capable of exerting effective and efficient vibration isolation when transporting a container-type data center having multiple racks loading one or more pieces of IT equipment fixed to a floor of the container-type data center. Specifically, there were demands for a means for providing effective measures against the vibration in the vertical direction.

Therefore, the present invention aims at providing a container-type data center having a vibration isolation table unit with a vibration isolation function disposed within the container, and transporting the container in a state where IT equipment are disposed on the vibration isolation table unit, so that the container can be operated immediately as a data center after transportation.

Solution to Problem

The present invention provides a container-type data center having an external shape corresponding to a container size for transportation, equipped with an air conditioning facility and loading multiple racks accommodating IT equipments in an interior thereof: on a floor surface of a container of the container-type data center are laid multiple vibration isolation table units composed of a lower plate and an upper plate with multiple spring vibration isolators arranged between the lower plate and the upper plate; and at least one rack storing the IT equipment is loaded on the vibration isolation table unit, and out of the multiple vibration isolation table units, the respective lower plates of adjacent vibration isolation table units are mutually fixed via a fixing member, and the respective upper plates are also mutually fixed via a fixing member.

Further according to the container-type data center of the present invention, two racks are mounted to each vibration isolation table unit.

Further according to the container-type data center of the present invention, the respective racks mounted on the vibration isolation table unit are arranged with clearances therebetween.

Advantageous Effects of Invention

The present invention enables to prevent vibration from being transmitted to the racks and the IT equipment stored in the racks via a spring vibration isolator disposed in the vibration isolation table unit arranged in the container, so that it becomes possible to store the racks and the IT equipment in the container in advance and perform various settings before transporting the container to its destination. Therefore, the container can start working as a data center immediately after transporting the container is finished, by simply securing a power supply and connecting the center to a communication network.

DESCRIPTION OF EMBODIMENTS

Now, the preferred embodiment for implementing the present invention will be described with reference to the drawings. Obviously, the present invention is easily applicable to configurations other than that illustrated in the present embodiment within the scope of the present invention. In the present specification, the longitudinal direction of a container is referred to as a "length direction", and a direction perpendicular thereto is referred to as a "width direction". Further, as for the terms "inner side" and "outside", the direction toward the inside of the container is referred to as "inside", and the direction toward the outer side thereof is referred to as "outside" or "outer side".

The present applicant has developed a container-type data center, as disclosed in non-patent literature 1. The disclosed data center has IT equipment such as a server and power supply/air conditioning facilities stored in a container, according to which the facilities required for a data center are gathered to provide a one-stop introduction and operation management. The size of its exterior is designed to facilitate transportation, so that transportation to various locations is enabled. The interior of the container adopts a layout to ensure sufficient maintenance space.

The container-type data center developed by the present applicant enables to realize automated operation by implementing a remote operation monitoring service. Further, the data center is designed to enable statuses of air-conditioning, power and power source to be confirmed, and to enable visual confirmation of the servers disposed within the container from a remote location using a monitoring camera. Therefore, it becomes possible to detect the occurrence of failure at an early stage, and to take measures for the failure. Further, the center is designed to detect abnormalities such as unauthorized invasion to the container, for example, through an outer monitoring operation using a monitoring camera, guarding of the circumference using laser, or entrance and exit control using biometric authentication.

Figure 1:
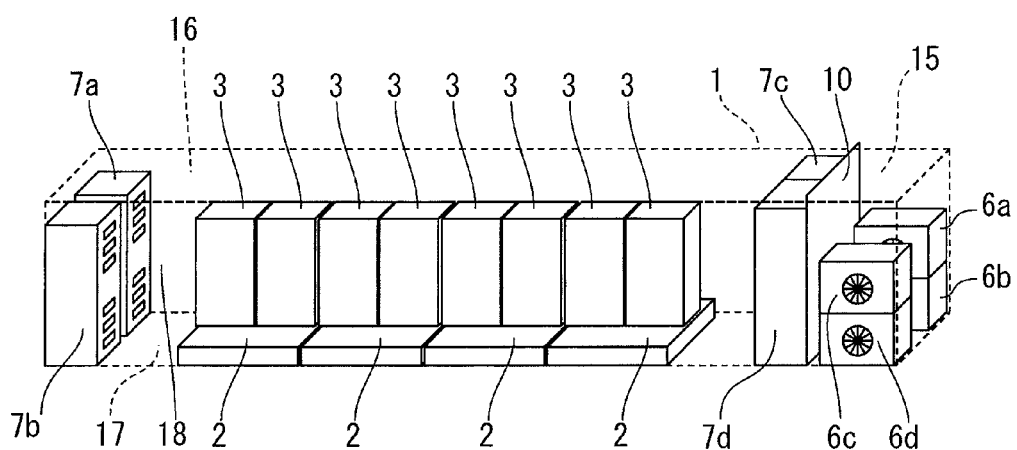
FIG. 1 is a perspective view illustrating an overall configuration of a container-type data center, and an outline of the status of installation of vibration isolation table units and racks according to the container-type data center of the present invention.

At first, the outline of the preferred embodiment of a container-type data center according to the present invention will be described with reference to FIGS. 1 and 2. In FIG. 1, a visible outline of a container constituting a container-type data center according to the present invention is illustrated by a dotted line 1. The container size and upper and lower connecting interfaces are designed in compliance with ISO container standards (ISO Standard 6346). A framework of a container 1 is composed of H steels made of iron, which is covered with a wall surface having a heat insulating material, and formed into a shape of a substantially rectangular parallelepiped. By forming the framework using H steels, it becomes possible to provide sufficient strength for stacking multiple containers 1, and to prevent deformation caused by vibration and the like. Further, twist-lock mechanisms not shown are formed at four corners on the upper and lower portions of the container 1, which have both the function of a positioning guide for stacking multiple containers 1 and the function for preventing displacement of the stacked containers.

The container-type data center of the present invention is a sealed steel container, and doors are made airtight. Internal heating generated from the IT equipment is cooled by an air conditioning unit disposed in the interior thereof, which adopts an air circulation system. Thus, unattended operation is enabled, and high waterproof and dustproof performances can be ensured during operation. However, there is a need to consider ventilation for manual operation within the container.

The external shape of the container can be designed freely according to the number of racks for installing the IT equipment, and the illustrated embodiment is designed equal to a 40-ft container size, with an interface unit for securing the container for transportation on ships and trailers. Thus, there are advantages in that securing is facilitated for transporting the container on ships, and that the container can be transported on a standard trailer for trailer transportation. However, shipment of the container on a ship is a product delivery of a completed product, so that there is a need to consider transportation that will not damage the main body of the container.

According to the container-type data center of the present invention, a vibration isolation table unit having a vibration isolating mechanism is disposed on a bottom portion of the container so as to enable transportation on a trailer with the IT equipment loaded therein. This mechanism enables to significantly reduce the acceleration of vibration in the vertical direction during transportation.

The container-type data center according to the present invention can be designed to enable outdoor units for the air conditioner of the container to be disposed on the same floor as the container on the outer side of the container having IT equipment arranged therein, for facilitating movement. Thereby, the refrigerant piping can be fixed, and there is no need to reinstall the outdoor units and lay the refrigerant piping every time the container is moved. Four air-cooled units are installed as the air conditioning facility, one of which is a spare.

According to the container-type data center of the present invention, a mechanism for sliding the IT equipment racks toward front and rear directions can be disposed on the bottom portion of the racks for ensuring maintenance space.

According to the embodiment illustrated in FIG. 1 of the container-type data center of the present invention, the dotted line 1 shows the external shape of the container having a structure in compliance with ISO Standards. The container 1 is formed by preparing two sets of frames formed in a substantially rectangular shape using H steels made of iron, each of which is formed as an upper side frame or a lower side frame, the four corners of which are connected via pillar sections 14a, 14b, 14c and 14d formed of H steels made of iron, thereby forming the framework having an overall substantially rectangular parallelepiped shape. A plate made of iron is mounted on the upper side frame to constitute a ceiling surface 16, and a plate made of iron is similarly mounted on the lower side frame to constitute a floor surface 17.

By forming the framework using H steels as described, it becomes possible to provide sufficient strength for stacking multiple containers 1 and to prevent the containers 1 from being deformed by vibration and the like. Further, although not illustrated, a common twist-lock mechanism is formed on the four corners of the upper side frame and the lower side frame of the container 1, which has both the function of a positioning guide for stacking multiple containers 1 and the function for preventing displacement of the stacked containers.

The container 1 is divided by a partition panel 10 into an IT equipment accommodation chamber 18 for accommodating racks 3 storing IT equipment (not shown) and an outdoor unit facility chamber 15 for the air conditioning facility. Partition pillar sections 14e and 14f formed of H steels similar to pillar sections 14a through 14d are disposed on the width-direction ends of the partition panel 10. An iron door 13 is disposed on a wall surface opposing to the outdoor unit facility chamber 15 of the container 1. Thereby, the area of the IT equipment accommodation chamber 18 of the container 1 is surrounded by the upper side frame, the lower side frame, pillar sections 14a, 14b and partition pillar sections 14e and 14f, and an enclosed space is formed with the iron plates attached to the ceiling surface 16, the floor surface 17 and side walls 19a and 19b, and the partition panel 10 and the iron doors 13 disposed on the end walls. According to the container-type data center of the present invention, the IT equipment accommodation chamber 18 forms an air-conditioned and enclosed space during operation, but during maintenance and the like, operators must enter and exit the IT equipment accommodation chamber 18, so that entrance/exit doors 11 and 12 are formed arbitrarily on side walls 19a and 19b. The iron door 13 on the wall surface opposed to the outdoor unit facility chamber 15 of the container 1 functions as an entrance opening for carrying in indoor units 7a, 7b, 7c and 7d of the air conditioning facilities, racks 3 and IT equipment to be stored in the racks to the container, and when carrying in of the components is completed, the entrance is closed.

The size of the outdoor unit facility chamber 15 in the length direction is 1.6 to 2 meters, and the detailed size can be set appropriately according to the size of the outdoor units 6a, 6b, 6c and 6d. The outdoor unit facility chamber 15 is opened without any side walls, and the outdoor units 6a, 6b, 6c and 6d can be directly exposed to outer air, so that the heat exchange efficiency can be enhanced. Two of the outdoor units 6a, 6b, 6c and 6d can be disposed along the width direction by having air discharge openings face the outer side of the container, and by stacking the units by using angle steel racks, a total of four units can be disposed by arranging the units on the upper and lower levels.

A refrigerant piping not shown is passed through the partition panel 10, connecting the outdoor units 6a, 6b, 6c and 6d disposed in the outdoor unit facility chamber 15 and indoor units 7a, 7b, 7c and 7d disposed in the IT equipment accommodation chamber 18. At this time, by adopting a flexible tube as the refrigerant piping (not shown), the refrigerant piping and the partition surface 10 will not be damaged even when vibration or displacement occurs to the outdoor units 6a, 6b, 6c and 6d or the indoor units 7a, 7b, 7c and 7d.

According to the container-type data center arranged as above, outdoor units 6a, 6b, 6c and 6d can be stored within the container without deviating from the ISO container standards, by providing the outdoor unit facility chamber 15 to fit in the external shape of the container. Further, by arranging the four outdoor units 6a, 6b, 6c and 6d so that the air discharge openings face to the outer side in the width direction, and arranging a greater number of air conditioning facilities compared to the prior art container-type data center, the cooling performance can be improved. Furthermore, the container can be transported while having the outdoor units 6a, 6b, 6c and 6d disposed therein, so that there is no need to re-install the outdoor units 6a, 6b, 6c and 6d and to construct the air conditioning piping at the transportation destination, and the required time from installation to the operation of the data center can be shortened.

Figure 2:
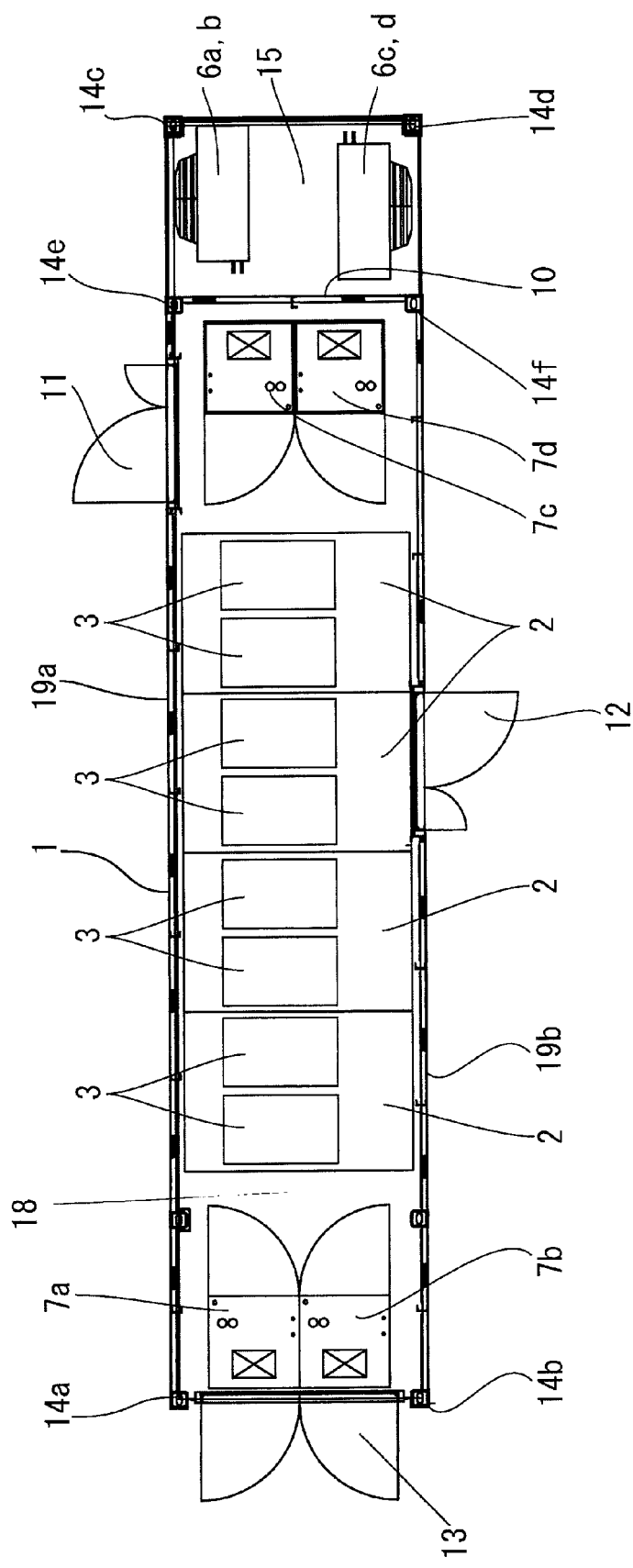
FIG. 2 is a plan view showing how the racks are set on the vibration isolation table units according to the container-type data center of the present invention.

As shown in FIGS. 1 and 2, multiple vibration isolation table units 2 can be laid inside the container 1 of the container-type data center of the present invention. Multiple racks 3 for accommodating IT equipment and the like not shown are placed on a single vibration isolation table unit 2. In FIGS. 1 and 2, two racks 3 are placed on one vibration isolation table unit 2. The number of racks placed on one vibration isolation table unit can be determined based on the size of the vibration isolation table unit and the rack, the overall weight of the rack with the IT equipment loaded thereon, and the strength and number of spring vibration isolators. Of course, it is possible to construct a unit of one-rack 3 having a vibration isolation function by placing a single rack 3 on a single vibration isolation table unit 2, so as to provide freedom of design of the rack arrangement within the container-type data center.

Figure 3:
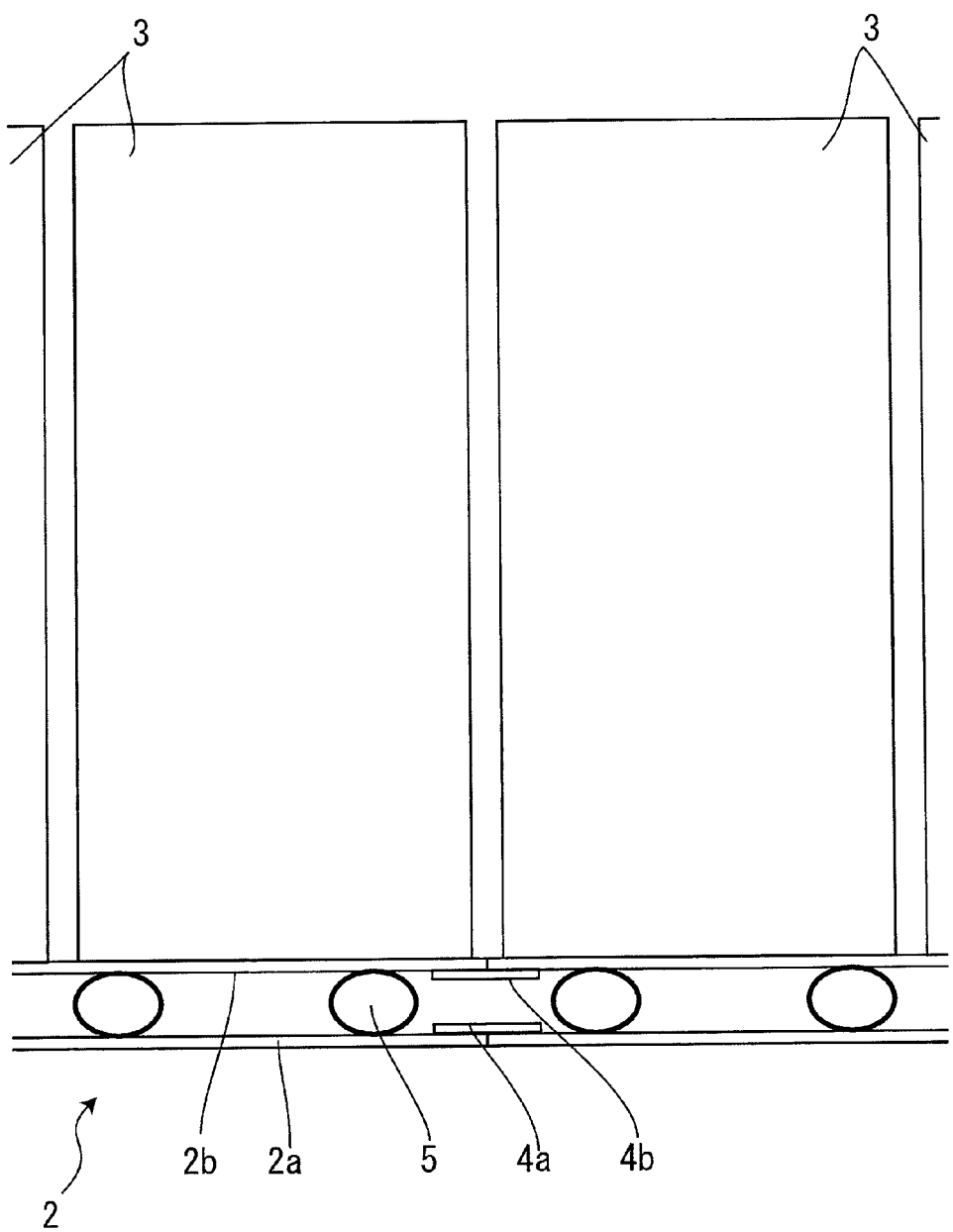
FIG. 3 is a side view of a vibration isolation configuration of vibration isolation table units in a state where racks are mounted on the vibration isolation table units in the container-type data center according to the present invention.

FIG. 3 is a side view illustrating the detailed configuration of a vibration isolation table 2 unit having racks 3 placed thereon. The vibration isolation table unit 2 is composed of a lower plate 2a and an upper plate 2b, with multiple spring vibration isolators 5 arranged between the upper and lower plates 2a and 2b. The spring vibration isolator 5 is required to provide a vibration isolation effect (of 1 G or smaller) with respect to the vibration in the vertical or horizontal direction during transportation. The adjacently-arranged vibration isolation table units 2 of the vibration isolation table units 2 having racks 3 accommodating IT equipment placed thereon have their adjacently arranged respective lower plates 2a mutually connected and fixed via an lower connecting member 4a and respective upper plates 2b mutually connected and fixed via a upper connecting member 4b. By connecting the respective adjacent vibration isolation table units 2, an integrated vibration isolation table as a whole can be formed. Further, the size of the vibration isolation table unit 2 in the width direction should preferably be set somewhat smaller than the size of the floor surface of the container 1 in the width direction, and the units are arranged with a clearance from the inner walls of the container 1. This is to prevent collision/contact/interference of the vibration isolation table unit 2 with the inner walls of the container 1 when absorbing the vibration generated in the container 1 by the spring vibration isolator 5. Further according to FIG. 3, racks 3 placed on the vibration isolation table unit 2 are arranged with a small clearance therebetween, which are also for preventing collision/contact/interference with the adjacent racks 3 by vibration.

Figure 4:
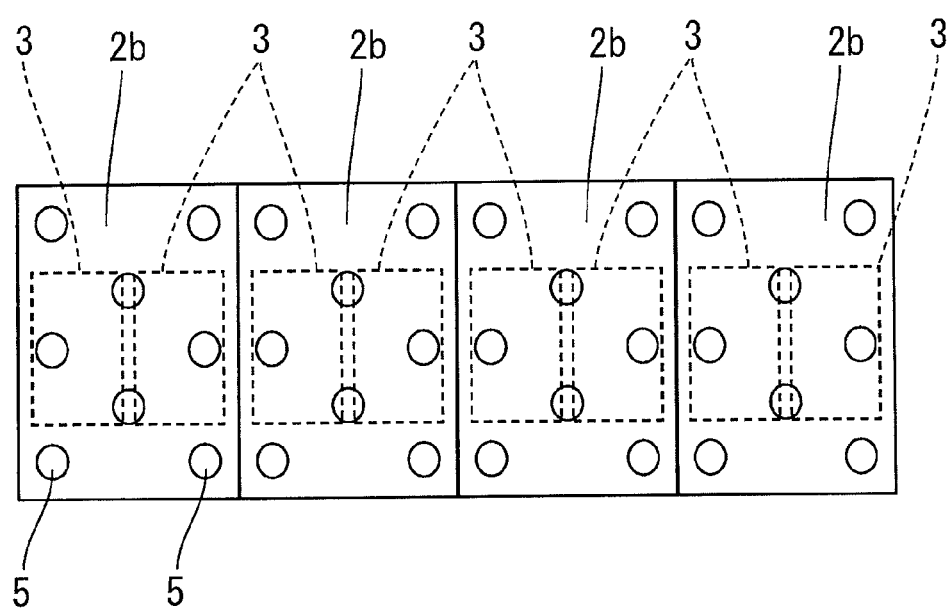
FIG. 4 is a plan view illustrating the example of arrangement of spring vibration isolators to be attached to the vibration isolation table units of the container-type data center according to the present invention.

FIG. 4 is a plan view showing the arrangement of spring vibration isolators 5 when racks 3 are placed on the vibration isolation table unit 2. As shown in FIG. 4, two isolators 5 are arranged at the center at even intervals, and a set of three spring vibration isolators 5 are similarly arranged respectively at even intervals on both sides thereof in the width direction of the vibration isolation table unit 2, so that a total of eight isolators are arranged. By arranging the spring vibration isolators 5 evenly as described, it becomes possible to absorb the violation in various directions by the spring vibration isolators 5 and to prevent vibration from being transferred to the upper plate 2b of the vibration isolation table unit 2 and the racks 3 placed thereon, even when vibration in the vertical direction and the horizontal direction occur to the container 1. Thus, by laying vibration isolation table units 2 in the container 1 and placing racks 3 thereon, vibration and other shocks will not be transmitted to the IT equipment, and the IT equipment will not be damaged or failed by the falling or detachment of components, even when the container is transported with the IT equipment arranged therein. Further, by limiting the number of racks loaded on the vibration isolation table unit 2 to two, the vibration isolation table unit 2 can be made compact, and an operation to lay the necessary number of units 2 corresponding to the number of racks to be stored in the container 1 can be adopted to realize cost reduction effects. Further, even when failure of spring vibration isolators 5 or the like occurs, only the failed area can be removed and fixed or replaced with a new component, so that superior maintainability is realized.

FIGS. 1 and 2 have illustrated an embodiment where the racks 3 are arranged at an offset position in the width direction of the vibration isolation table unit 2, but FIG. 4 illustrates an embodiment where the width-direction center position of the racks are arranged to correspond to the center of the vibration isolation table unit 2. These arrangements can be selected either by arranging hot aisles and cold aisles evenly or by forming the capacity of either one greater than the other within the range enabling maintenance and other operations to be performed by operators.

The embodiments of the present invention have been described in detail, but the present invention is not restricted to the above-illustrated embodiments, and various deformations are enabled within the scope of the invention. For example, the spring vibration isolators 5 can adopt any shape as long as the vibration in the vertical and horizontal directions can be absorbed.

REFERENCE SIGNS LIST

1 Container
2 Vibration isolation table unit
2a Lower plate
2b Upper plate
3 Rack
4a Lower fixing member
4b Upper fixing member
5 Spring vibration isolator

The invention claimed is:

1. A container data center including:
a transportable container having a floor surface, wherein the container forms an outermost extent of the container data center such that the container data center is transportable;
an air conditioning facility;
multiple racks adapted to accommodate IT equipment and disposed within an interior of the container;
multiple vibration isolation table units disposed on the floor surface of the container, wherein the vibration isolation table units are respectively composed of a lower plate and an upper plate, with multiple spring vibration isolators arranged between the lower plate and the upper plate, wherein at least one of the racks adapted to accommodate the IT equipment is disposed on one of the vibration isolation table units; and
a connecting assembly that connects adjacent vibration isolation table units of the multiple vibration table units together, wherein respective lower plates of adjacent vibration isolation table units are mutually connected together via the connecting assembly, and wherein respective upper plates of the adjacent vibration isolation table units are mutually connected together via the connecting assembly such that the adjacent vibration isolation table units form an integrated vibration isolation table.

2. The container data center according to claim 1, wherein at least two racks of the multiple racks are disposed on each vibration isolation table unit.

3. The container data center according to claim 2, wherein each of the at least two racks are arranged with clearances therebetween.

4. The container data center according to claim 3, wherein the at least two racks are spaced apart along a plane defined by a major surface, of the at least one vibration isolation table, that supports the at least two racks such that the clearances extend along the plane between the at least two racks.

5. The container data center according to claim 1, wherein at least two racks of the multiple racks are disposed on at least one of the vibration isolation table units and are arranged with clearances therebetween.

6. The container data center according to claim 5, wherein the at least two racks are spaced apart along a plane defined by a major surface, of the at least one vibration isolation table, that supports the at least two racks such that the clearances extend along the plane between the at least two racks.

7. The container data center according to claim 1, wherein the connecting assembly includes an upper connecting member that joins adjacent upper plates together such that the adjacent vibration isolation table units form an integrated vibration isolation table.

8. The container data center according to claim 7, wherein the upper connecting member is disposed on a surface, of each corresponding upper plate, that faces toward the corresponding lower plate.

9. The container data center according to claim 1, wherein the connecting member is disposed between the lower plate and the upper plate.

10. The container data center according to claim 1, further including the IT equipment installed in an interior of the container data center.

11. The container data center according to claim 1, wherein the connecting assembly engages adjacent end portions of the respective upper plates such that the respective upper plates are mutually fixed via the connecting assembly.

* * * * *